United States Patent
Torok et al.

(10) Patent No.: US 9,299,433 B1
(45) Date of Patent: Mar. 29, 2016

(54) METHOD AND APPARATUS FOR MULTI-RANGE LOOK-UP

(71) Applicant: Marvell Israel (M.I.S.L) Ltd., Yokneam (IL)

(72) Inventors: Ruven Torok, Tel Aviv (IL); Oren Shafrir, Tel Aviv (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 775 days.

(21) Appl. No.: 13/692,476

(22) Filed: Dec. 3, 2012

Related U.S. Application Data (60) Provisional application No. 61/566,355, filed on Dec. 2, 2011.

(51) Int. Cl.
*G06F 12/08* (2006.01)
*G11C 15/00* (2006.01)

(52) U.S. Cl.
CPC ..................................... *G11C 15/00* (2013.01)

(58) Field of Classification Search
CPC ..... G11C 15/00; G11C 15/04; G11C 17/30982
USPC .................. 711/108, 114, 161, 162; 360/392
See application file for complete search history.

(56) References Cited

U.S. PATENT DOCUMENTS

| | | |
|---|---|---|
| 6,449,656 B1 | 9/2002 | Elzur et al. |
| 6,633,953 B2 * | 10/2003 | Stark ............................. 711/108 |
| 6,658,002 B1 | 12/2003 | Ross et al. |
| 6,691,168 B1 | 2/2004 | Bal et al. |
| 6,700,889 B1 * | 3/2004 | Nun ............................... 370/392 |
| 6,717,946 B1 | 4/2004 | Hariguchi et al. |
| 6,775,081 B2 | 8/2004 | Ottesen et al. |
| 6,839,800 B2 * | 1/2005 | Stark ............................. 711/108 |
| 7,093,092 B2 | 8/2006 | Stojancic |
| 7,304,992 B2 | 12/2007 | Relan |
| 7,366,830 B1 * | 4/2008 | Maheshwari ................. 711/108 |
| 7,457,292 B2 | 11/2008 | Asano |
| 7,492,763 B1 | 2/2009 | Alexander, Jr. |
| 7,724,740 B1 | 5/2010 | Wang et al. |
| 8,139,591 B1 * | 3/2012 | Goel et al. .................... 370/401 |

(Continued)

OTHER PUBLICATIONS

Aug. 31, 2010 Office Action issued in U.S. Appl. No. 12/109,703.

(Continued)

*Primary Examiner* — Aimee Li
*Assistant Examiner* — Edmund Kwong (57) ABSTRACT

Aspects of the disclosure provide a circuit that includes a first memory, a second memory and a comparator. The first memory is configured to store a plurality of values corresponding to a first plurality of ranges and generate an output value in response to a lookup key. The output value is indicative of the lookup key matching a stored value corresponding to a first range in the first plurality of ranges. The second memory is configured to store limiting values of a second plurality of ranges, and output a set of limiting values for a second range in association with the first range based on the output value of the first memory. The comparator is configured to compare the input value with the set of limiting values to determine whether the second range is inclusive of the lookup key.

20 Claims, 5 Drawing Sheets

(56) References Cited

U.S. PATENT DOCUMENTS

| | | |
|---|---|---|
| 2002/0075714 A1 | 6/2002 | Pereira et al. |
| 2002/0126672 A1 | 9/2002 | Chow et al. |
| 2002/0191605 A1 | 12/2002 | Lunteren et al. |
| 2003/0191740 A1 | 10/2003 | Stark |
| 2004/0258043 A1 | 12/2004 | Engbersen et al. |
| 2005/0081058 A1 | 4/2005 | Chang et al. |
| 2006/0114908 A1 | 6/2006 | Kalkunte et al. |
| 2006/0136570 A1 | 6/2006 | Pandya |
| 2006/0155915 A1 | 7/2006 | Pereira |

OTHER PUBLICATIONS

Feb. 1, 2011 Office Action issued in U.S. Appl. No. 12/109,703.
Nov. 7, 2011 Office Action issued in U.S. Appl. No. 12/109,703.
May 3, 2012 Office Action issued in U.S. Appl. No. 12/109,703.
Apr. 14, 2010 Office Action issued in U.S. Appl. No. 12/109,711.
Sep. 13, 2010 Office Action issued in U.S. Appl. No. 12/109,711.
Sep. 14, 2011 Office Action issued in U.S. Appl. No. 12/109,711.
May 22, 2012 Office Action issued in U.S. Appl. No. 12/109,711.
Bremler-Barr, Anat et al.; *Space-Efficient TCAM-based Classification Using Gray Coding*; INFOCOM 2007; pp. 1388-1396; 2007.

\* cited by examiner

FIG. 1

| | UPPER LIMIT | LOWER LIMIT | TCAM FRIENDLY ENCODING |
|---|---|---|---|
| R1 | 0000001110 | 0000001011 | 0000001XXX |
| R2 | 0000001010 | 0000000101 | 000000XXXX |
| R3 | 1001111001 | 1001010101 | 1001XXXXXX |
| R4 | 0110101011 | 0101110000 | 01XXXXXXXX |

METHOD AND APPARATUS FOR MULTI-RANGE LOOK-UP

INCORPORATION BY REFERENCE

This present disclosure claims the benefit of U.S. Provisional Application No. 61/566,355, "Multi-Range Look-Up Using TCAM" filed on Dec. 2, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing are neither expressly nor impliedly admitted as prior art against the present disclosure.

Multi-range look-up is needed in various applications. For example, in a packet processor, operations on packets can be defined in association with ranges of values for a packet parameter. When the packet processor receives a packet, the packet processor extracts a value of the packet parameter from the received packet, and performs a look up using the value to determine a particular range that the value is within. Then, the packet processor performs an operation in association with the particular range on the received packet.

SUMMARY

Aspects of the disclosure provide a circuit that includes a first memory, a second memory and a comparator. The first memory is configured to store a plurality of values corresponding to a first plurality of ranges and generate an output value in response to a lookup key. The output value is indicative of the lookup key matching a stored value corresponding to a first range in the first plurality of ranges. The second memory is configured to store limiting values of a second plurality of ranges, and output a set of limiting values for a second range in association with the first range based on the output value of the first memory. The comparator is configured to compare the input value with the set of limiting values to determine whether the second range is inclusive of the lookup key.

Further, in an embodiment, the circuit includes a combine logic configured to combine a comparison result from the comparator with the output value of the first memory to generate a lookup result of the lookup key with regard to the second plurality of ranges. Further, in an example, the circuit includes a third memory configured to store action codes in association with the second plurality of ranges, and output an action code based on the lookup result.

According to an aspect of the disclosure, the first memory is a ternary content addressable memory (TCAM) configured to store ternary bits. In an embodiment, the TCAM is configured to store each of the first plurality of ranges in a single entry. In an example, the TCAM is configured to store the first range with a largest number of common most significant bits (MSBs) in the second range.

Aspects of the disclosure provide a method. The method includes storing a plurality of values corresponding to a first plurality of ranges, storing limiting values for a second plurality of ranges that are respectively in association with the first plurality of ranges, and generating an output value in response to a lookup key. The output value is indicative of the lookup key matching a value corresponding to a first range in the first plurality of ranges. Further, the method includes determining a set of limiting values for a second range that is in association with the first range based on the output value, and comparing the lookup key with the set of limiting values to determine whether the second range is inclusive of the lookup key.

Aspects of the disclosure also provide a packet processor. The packet processor includes a first memory, a second memory and a comparator. The first memory is configured to store a plurality of values corresponding to a first plurality of ranges and generate an output value in response to an input value of a packet parameter extracted from a received packet. The output value is indicative of the input value matching a stored value corresponding to a first range in the first plurality of ranges. The second memory is configured to store limiting values of a second plurality of ranges, and output a set of limiting values for a second range in association with the first range based on the output value of the first memory. The comparator is configured to compare the input value with the set of limiting values to determine whether the second range is inclusive of the input value.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
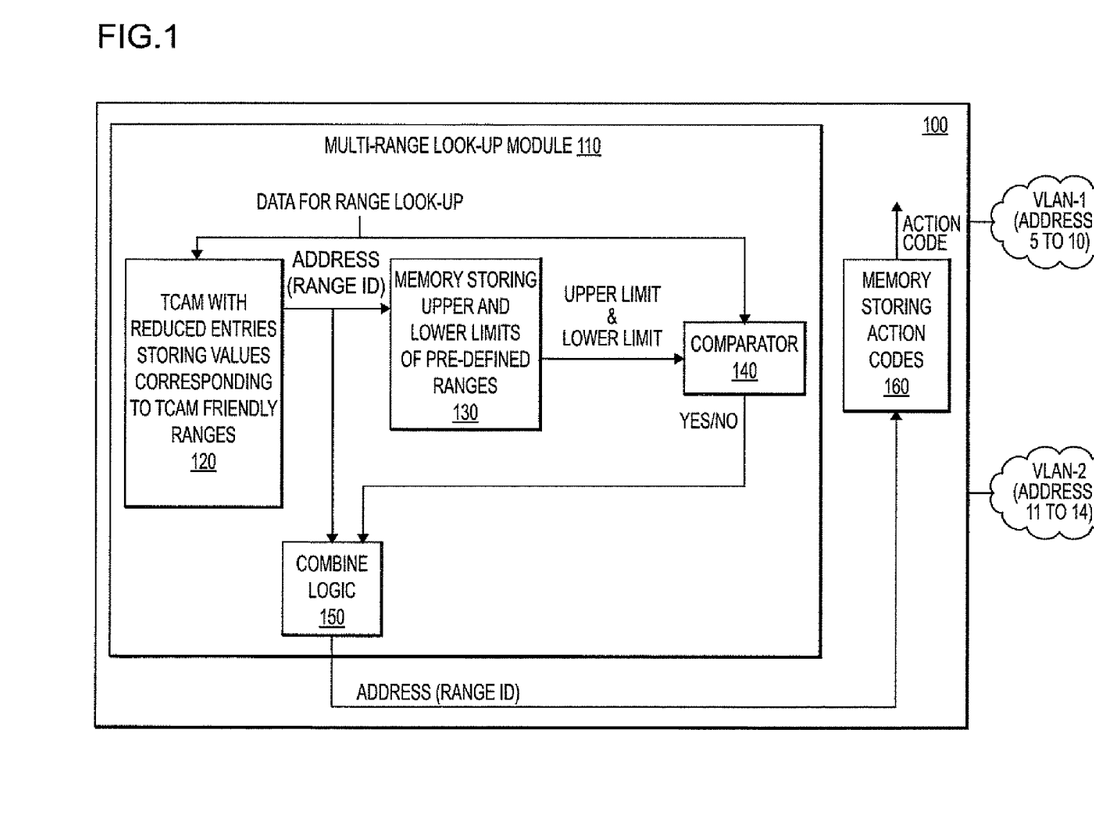
FIG. 1 shows a block diagram of an electronic device example 100 according to an embodiment of the disclosure.

FIG. 1 shows a block diagram of an electronic device example 100 according to an embodiment of the disclosure. The electronic device 100 includes a multi-range look-up module 110. The multi-range look-up module 110 is configured to receive data for range look-up, and look up a particular range among a plurality of ranges that the data is within the particular range.

The electronic device 100 can be any suitable device, such as a network server, a packet switching device, and the like, that uses multi-range look-up during operation. In an example, the electronic device 100 is a packet switching device 100 that includes ingress ports and egress ports. The packet switching device 100 is used in a network for packet switching. For example, the packet switching device 100 is coupled to a first virtual local area network VLAN-1 and a second virtual local area network VLAN-2. The first virtual local area network VLAN-1 is defined to include nodes with an address from 5 to 10, and the second virtual local area network VLAN-2 is defined to include nodes with the address from 11 to 14 for example. The packet switching device 100 receives packets from the ingress ports, and performs actions on the received packets, such as forwarding to suitable egress ports, and the like, based on one or more packet parameters, such as a virtual local area network (VLAN) identification, a source Internet Protocol (IP) address, a destination Internet Protocol (IP) address, and the like.

In an embodiment, actions on the received packets are defined in association with ranges of a parameter. For example, a first action "forwarding to egress port 1" is defined in association with a first value range of the destination IP address, and a second action "forwarding to egress port 2" is defined in association with a second value range of the destination IP address.

In the FIG. 1 example, when the packet switching device 100 receives a packet from an ingress port, the header of the packet is processed to extract a value of the destination IP address. The value is provided to the multi-range look-up module 110 to look-up a particular range among a plurality of pro-defined ranges for the destination IP address. Further, based on the particular range, the packet switching device 100 performs the action in association with the particular range on the packet.

Specifically, in the FIG. 1 example, the packet switching device 100 includes a memory 160 configured to store action codes in association with range identifications. When the multi-range look-up module 110 Identifies the particular range, the multi-range look-up module 110 outputs a range identification for the particular range. Based on the range identification, an action code in association with the range identification can be retrieved from the memory 160, and then an action, such as forwarding a packet, dropping a packet, and the like, can be performed on the received packet.

According to an embodiment of the disclosure, the multi-range look-up module 110 includes a ternary content addressable memory (TCAM) 120, a memory 130, a comparator 140, and a combine logic 150. These elements are coupled together as shown in FIG. 1.

The TCAM module 120 includes one or more TCAM banks. A TCAM bank includes an array of storage elements arranged in rows and columns. Each storage element has ternary states for storing a ternary bit, such as logic "0", logic "1" or mask "X". Further, the storage element can be compared to a binary bit (logic "0" or logic "1") to determine a match or non-match. In an embodiment, mask "X" matches both logic "0" and logic "1".

The storage elements of a TCAM bank are suitably coupled to form storage entries. In an example, storage elements in a row are coupled to a match line to form a storage entry. The match line is configured to indicate a match status of the storage entry to a lookup key of binary bits extracted, for example, from a packet. In an example, the match line is pre-charged to a relatively high voltage. When a storage element in the storage entry does not match a corresponding bit in the lookup key, a discharging path is turned on to pull down the match line voltage. However, when all the storage elements in the storage entry match their corresponding bits in the lookup key, the match line voltage stays at the relatively high voltage indicating a matching storage entry. It is noted that more than one storage entries can match the same lookup key.

The storage entries are addressed, and prioritized. In an example, a TCAM bank includes 256 storage entries that are addressed by 8-bits. The 256 storage entries are also prioritized based on their addresses. In an example, the storage entry with a relatively lower address has a relatively higher priority. When multiple storage entries match a same lookup key, the storage entry with the highest priority is the hitting storage entry of the TCAM bank. Generally, the TCAM bank includes a priority encoder (not shown) that priorities the address of the hitting storage entry.

Ranges are encoded and stored in the storage entries. In an example, a range [0, 1] is encoded and stored in a 10-bit field by "000000000X", and a range [8, 11] is encoded and stored in the 10-bit field by "00000010XX". Some ranges may need to be encoded and stored in multiple storage entries. In an example, a range [4, 11] is encoded and stored in two storage entries by "00000001 XX" and "00000010XX".

In an embodiment, The TCAM 120 is configured to store values corresponding to TCAM friendly ranges. The TCAM friendly ranges respectively correspond to the plurality of pre-defined ranges. According to an embodiment of the disclosure, a TCAM friendly range corresponding to a pre-defined range can be stored in the TCAM 120 with a reduced number of TCAM entries. In an example, a TCAM friendly range can be stored in a single TCAM entry. Further, in an embodiment, the TCAM friendly range corresponding to the pre-defined range includes the pre-defined range, and the pre-defined range is a sub-range of the TCAM friendly range. Thus, when the data for range look-up is within the pre-defined range, the data is also within the TCAM friendly range corresponding to the pre-defined range.

According to an aspect of the disclosure, when the plurality of pre-defined ranges are non-overlapping ranges, a TCAM friendly range can be uniquely determined for each pre-defined range, and the TCAM friendly range can be stored in the TCAM by a single entry.

Specifically, in an example, a TCAM friendly range for a pre-defined range is determined to be a range that can be expressed in ternary as a combination of the largest number of common most significant bits (MSBs) of the pre-defined range with mask bits at the rest of the bit positions. Then, the TCAM friendly range can be expressed as a ternary bit sequence, and can be stored in the TCAM by a single entry. In addition, it can be proved that when two pre-defined ranges are non-overlapping, the two ternary bit sequences corresponding to the two pre-defined ranges have at least one different ternary bit. Thus, when the pre-defined ranges are not overlapping, the ternary bit sequences of the TCAM friendly ranges for the pre-defined ranges are unique.

Further, according to an embodiment of the disclosure, the TCAM friendly ranges are prioritized in the TCAM 120 according to the number of mask bits. For example, a TCAM friendly range with the least number of mask bits has the highest priority, and a TCAM friendly range with the most number of mask bits has the lowest priority.

During operation, for example, when the multi-range lookup module 110 receives the data for range look-up, the data is provided to the TCAM 120 as the lookup key of the TCAM 120. When the data is within a pre-defined range, the data is within a TCAM friendly range corresponding to the pre-defined range. Thus, the lookup key matches a ternary bit sequence stored in the TCAM 120 that represents the TCAM friendly range. The TCAM 120 then outputs a TCAM address of an entry that stores the matching ternary bit sequence. The TCAM address can be used to identify the TCAM friendly range, and thus can be used to identify the pre-defined range that the data is within. Thus, the address can be used as a range identification.

The memory 130 stores upper limits and lower limits of the plurality of pre-defined ranges. In an example, an upper limit and a lower limit of a pre-defined range define the boundaries of the pre-defined range within the corresponding TCAM friendly range. In an example, the memory 130 stores an upper limit and a lower limit for a pre-defined range at a memory address that can be determined based on the TCAM address (range identification) of the entry that stores the TCAM friendly range corresponding to the pre-defined range. Thus, based on the TCAM address output by the TCAM 120, the upper limit and the lower limit of the pre-defined range can be retrieved from the memory 130.

The comparator 140 compares the data for range look-up with the upper limit and the lower limit to determine whether the data is within the pre-defined range with the upper limit and lower limit. For example, when the data is smaller than the lower limit or is larger than the upper limit, the comparator 140 outputs "0" indicating that the data is not in the pre-defined range with the upper limit and the lower limit; otherwise, the comparator outputs "1" indicating that the data is within the pre-defined range with the upper limit and the lower limit. The comparator 140 can be implemented by comparator circuits.

The combine logic 150 can be implemented using any suitable logic circuits. The combine logic 150 receives the TCAM address output from the TCAM 120, and the comparison result from the comparator 140, and generates a look-up result of the multi-range look-up module 110. In an example, when the comparison result is "1", the combine logic 150 provides the TCAM address that is indicative of the range identification for the pre-defined range as the look-up result. When the comparison result is "0", the combine logic 150 provides a default TCAM address indicating that the data is not in any of the pre-defined ranges. The look-up result of the multi-range look-up module 110 can be provided to other modules, such as the memory 160 and the like for various operations of the electronic device 100.

According to an aspect of the disclosure, the TCAM 120 stores the TCAM friendly ranges corresponding to the pre-defined ranges to reduce the number of needed entries. Thus, in an example, the TCAM 120 can be implemented with a reduced number of entries to save silicon area. Further, in the FIG. 1 example, the multi-range look-up module 110 uses the TCAM 120 to perform multiple TCAM friendly range look-up at the same time, and uses the comparator 140 to determine whether the data is within a pre-defined range corresponding to the matching TCAM friendly range. The implementation of the multi-range look-up module 110 saves silicon area in comparison with solely TCAM implemented multi-range lookup and saves time in comparison with solely comparator implemented multi-range lookup.

It is noted that, in an embodiment, the multi-range look-up module 110 is implemented on an integrated circuit (IC) chip. The memory 160 can be implemented on the same IC chip or a different IC chip.

Figure 2:
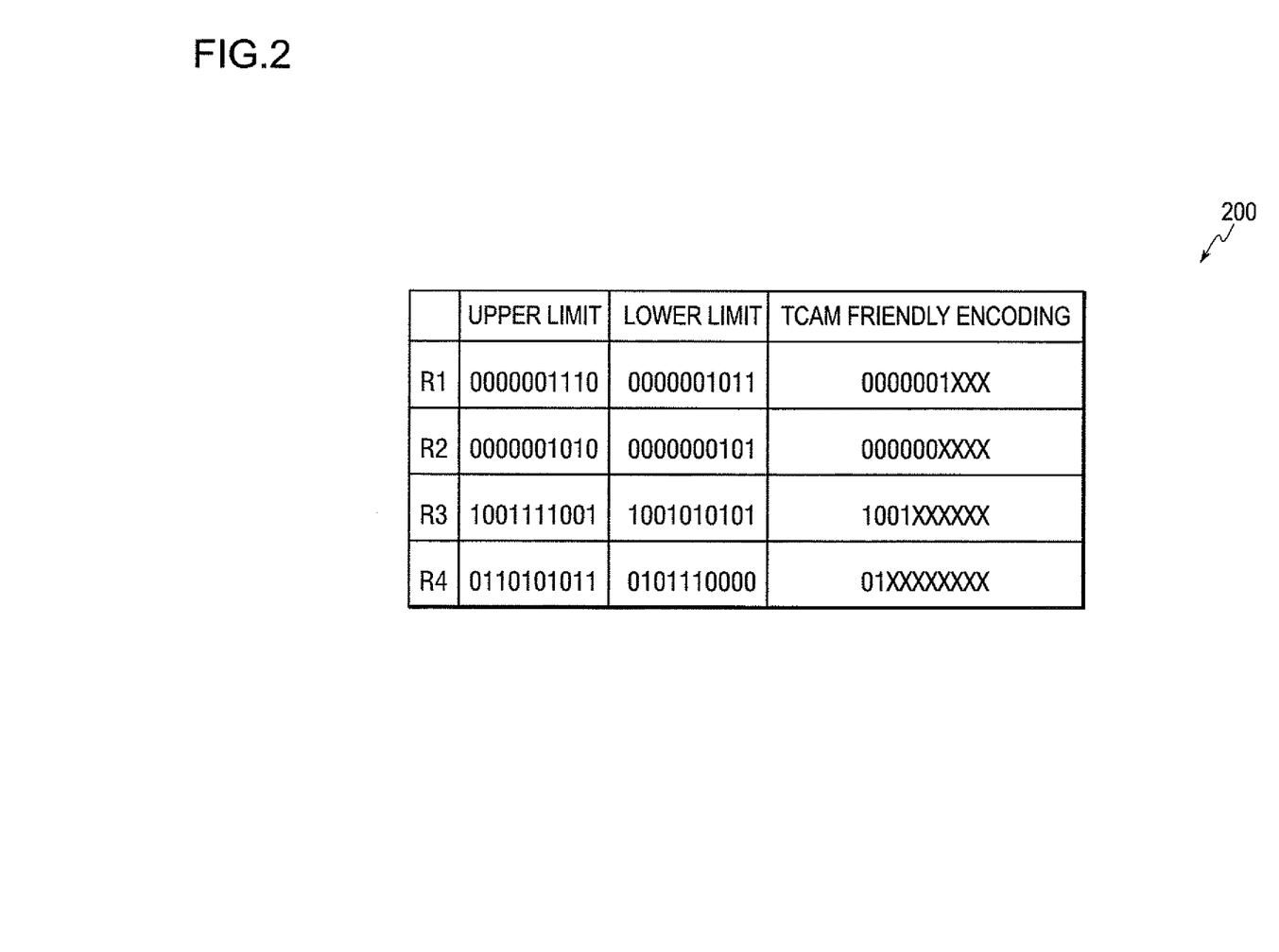
FIG. 2 shows examples of TCAM friendly range encoding according to an embodiment of the disclosure.

FIG. 2 shows TCAM friendly range encoding examples 200 according to an embodiment of the disclosure. In the FIG. 2 example, a TCAM friendly range for a pre-defined range is encoded as a range that is expressed in ternary as a combination of the largest number of common MSBs of the pre-defined range, such as the largest number of common MSBs of the upper limit and lower limit for the pre-defined range, with mask bits at the rest of the bit positions (least significant bit positions).

In the FIG. 2 example, upper limits and lower limits are represented as a binary bit sequence of 10 bits "$b_9b_8b_7b_6b_5b_4b_3b_2b_1b_0$" with $b_9$ being the most significant bit, and $b_0$ being the least significant bit, and the TCAM friendly ranges are represented as a ternary bit sequence of 10 bits "$t_9t_8t_7t_6t_5t_4t_3t_2t_1t_0$" with $t_9$ being the most significant bit, and to being the least significant bit. In an example, to encode a pre-defined range with an upper limit and a lower limit into a TCAM friendly range, starting from the most significant bit, the corresponding bit values of the upper limit and the lower limit at bit positions are compared. When the bit values of the upper limit and the lower limit at a bit position are common, a corresponding ternary bit for the ternary bit sequence is encoded to be the same bit value. This operation continues until at a specific bit position that the bit values of the upper limit and the lower limit are not the same. Then, the ternary bits from the specific bit position to the least significant bit for the ternary bit sequence are encoded to be the mask bits.

For example, a first range (R1) is [11, 14] in decimal. The upper limit and the lower limit have the same bit values from $b_9$ to $b_3$, and differ at $b_2$. Thus, $t_9$ to $t_3$ of the TCAM friendly range are encoded to have the same bit values as $b_9$ to $b_3$ of the upper limit and the lower limit, and $t_2$ to $t_0$ of the TCAM friendly range are encoded with mask bits. Similarly, a second range (R2) is [5, 10] in decimal. The upper limit and the lower limit have the same bit values from $b_9$ to $b_4$, and differ at $b_3$. Thus, $t_9$ to $t_4$ of the TCAM friendly range are encoded to have the same bit values as $b_9$ to $b_4$ of the upper limit and the lower limit, and $t_3$ to $t_0$ of the TCAM friendly range are encoded with mask bits.

Similarly, a third range (R3) is [597, 633] in decimal. The upper limit and the lower limit have the same bit values from $b_9$ to $b_6$, and differ at $b_5$. Thus, $t_9$ to $t_6$ of the TCAM friendly range are encoded to have the same bit values as $b_9$ to $b_6$ of the upper limit and the lower limit, and $t_7$ to $t_0$ of the TCAM friendly range are encoded with mask bits.

Similarly, a fourth range (R4) is [368, 427] in decimal. The upper limit and the lower limit have the same bit values from $b_9$ to $b_8$, and differ at $b_7$. Thus, $t_9$ to $t_0$ of the TCAM friendly range are encoded to have the same bit values as $b_9$ to $b_8$ of the upper limit and the lower limit, and $t_7$ to $t_0$ of the TCAM friendly range are encoded with mask bits.

The ranges R1-R4 are non-overlapping ranges, thus the TCAM friendly ranges corresponding to the ranges R1-R4 are uniquely represented in ternary.

Figure 3:
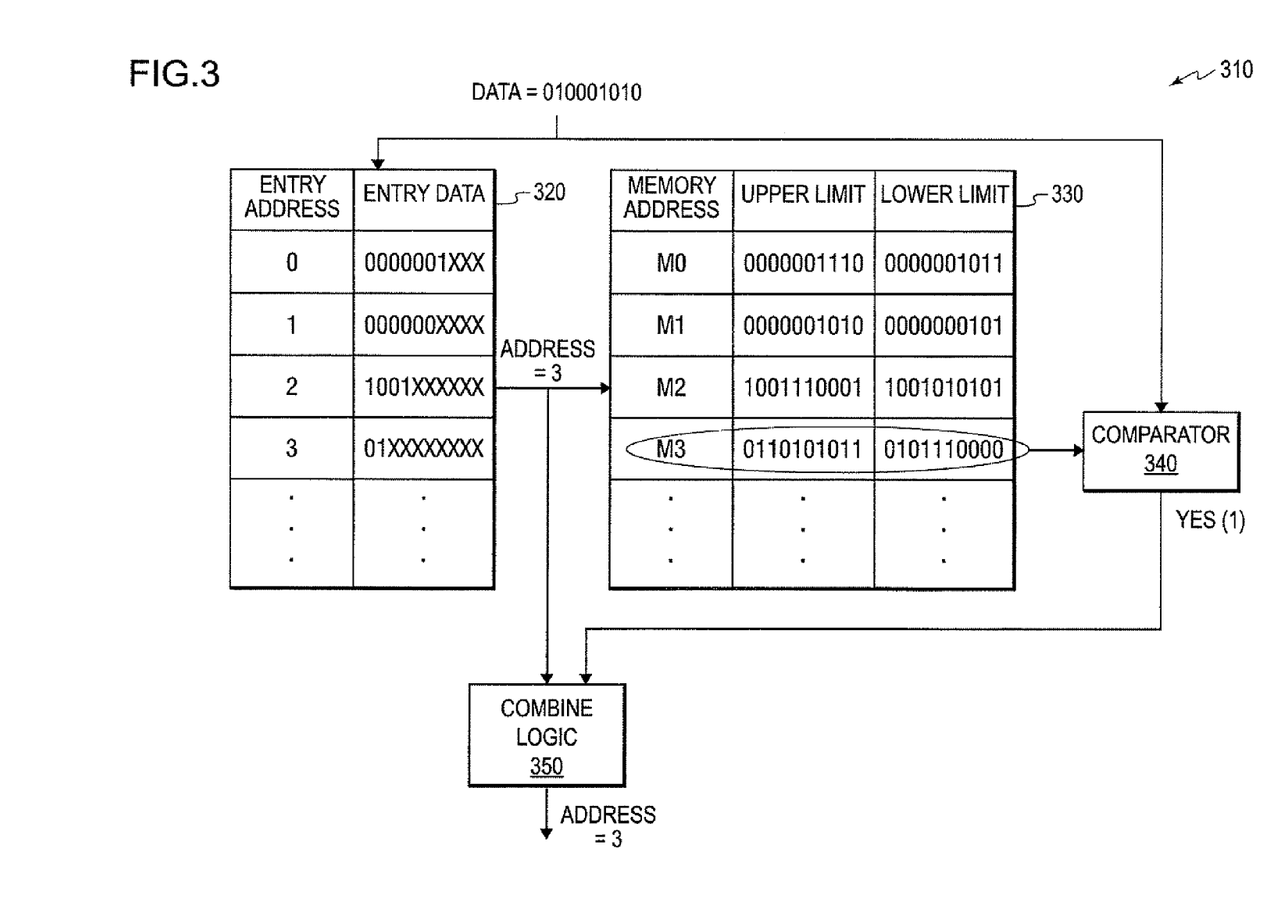
FIG. 3 shows a block diagram of a multi-range look-up module 310 according to an embodiment of the disclosure.

FIG. 3 shows a block diagram of a multi-range look-up module 310 according to an embodiment of the disclosure. The multi-range look-up module 310 includes a TCAM 320, a memory 330, a comparator 340, and a combine logic 350. These elements are coupled together as shown in FIG. 3.

The TCAM 320, the memory 330, the comparator 340, and the combine logic 350 are similarly configured as the TCAM 120, the memory 330, the comparator 340 and the combine logic 150. The description of these components has been provided above and will be omitted here for clarity purposes.

In the FIG. 3 example, the multi-range look-up module 310 is configured to perform multi-range look-up for the pre-defined ranges R1-R4 in the FIG. 2 example. Specifically, the TCAM friendly ranges corresponding to the pre-defined ranges R1-R4 are prioritized in the TCAM 320 according to the number of mask bits. For example, the range R1 has the least number of mask bits, and is stored in TCAM entry address 0 that has the highest priority, and the range R4 has the most number of mask bits, and is stored in TCAM entry address 3 that has the lowest priority.

According to the disclosure, the memory 330 stores upper limits and lower limits of the plurality of pre-defined ranges in association with the TCAM friendly ranges. For example, an upper limit and a lower limit are the boundaries of a pre-defined range in a TCAM friendly range. Specifically, in the FIG. 3 example, the memory 330 stores an upper limit and a lower limit for a pre-defined range at a memory address that can be determined based on the TCAM entry address that stores the corresponding TCAM friendly range. For example, at memory address M0 that can be determined based on TCAM entry address 0, the memory 330 stores the upper limit and the lower limit for the range R1; at memory address M1 that can be determined based on TCAM entry address 1, the memory 330 stores the upper limit and the lower limit for the range R2; at memory address M2 that can be determined based on TCAM entry address 2, the memory 330 stores the upper limit and the lower limit for the range R3; and at memory address M3 that can be determined based on TCAM entry address 3, the memory 330 stores the upper limit and the lower limit for the range R4.

During operation, for example, when the multi-range lookup module 310 receives data "010001010" in binary, the data is provided to both the TCAM 320 and the comparator 340. The TCAM 320 uses the data as the lookup key and compares the data with the multiple TCAM friendly ranges stored in the TCAM 320 at the same time. When the data matches one of the TCAM entries, such as the one with the TCAM entry address 3 in the FIG. 3 example, the TCAM 320 outputs the TCAM entry address (e.g., address=3) of the matching TCAM entry.

Based on the TCAM entry address 3, the memory address M3 is determined, and the upper limit and the lower limit stored at the memory address 3 are retrieved and provided to the comparator 340. Then, the comparator 340 compares the data with the upper limit and the lower limit to determine whether the data is in the pre-defined range defined by the upper limit and the lower limit. The comparison result is provided to the combine logic 350. The combine logic 350 combines the TCAM entry address output from the TCAM 320 with the comparison result and generates the look-up output.

Figure 4:
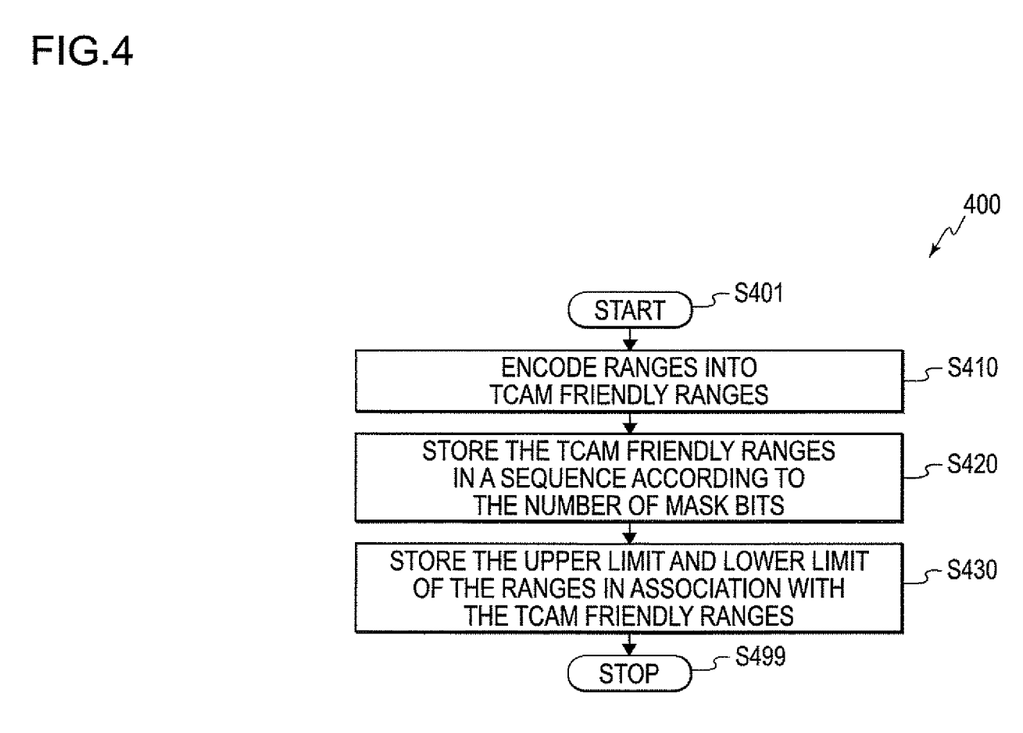
FIG. 4 shows a flow chart outlining a process example 400 according to an embodiment of the disclosure.

FIG. 4 shows a flow chart outlining a process example 400 for configuring a multi-range look-up module, such as the multi-range look-up module 310, according to an embodiment of the disclosure. The process starts at S401, and proceeds to S410.

At S410, multiple ranges are encoded into TCAM friendly ranges. In the embodiment, an electronic device, such as the electronic device 100, includes an encoder to encode the multiple ranges into the TCAM friendly ranges according to the encoding examples in FIG. 2. The encoder can be implemented as a processor executing software codes, or can be implemented by circuits.

At S420, the TCAM friendly ranges are stored in a TCAM in a sequence according to the number of mask bits. In the FIG. 3 example, the TCAM friendly ranges are prioritized and stored in the TCAM 320 according to the number of mask bits.

At S430, the upper limits and the lower limits of the multiple ranges are stored in association with the TCAM friendly ranges. In the FIG. 3 example, an upper limit and a lower limit of a range is stored at a memory address that can be determined based on a TCAM entry address of the corresponding TCAM friendly range. Then, the process proceeds to S499 and terminates.

Figure 5:
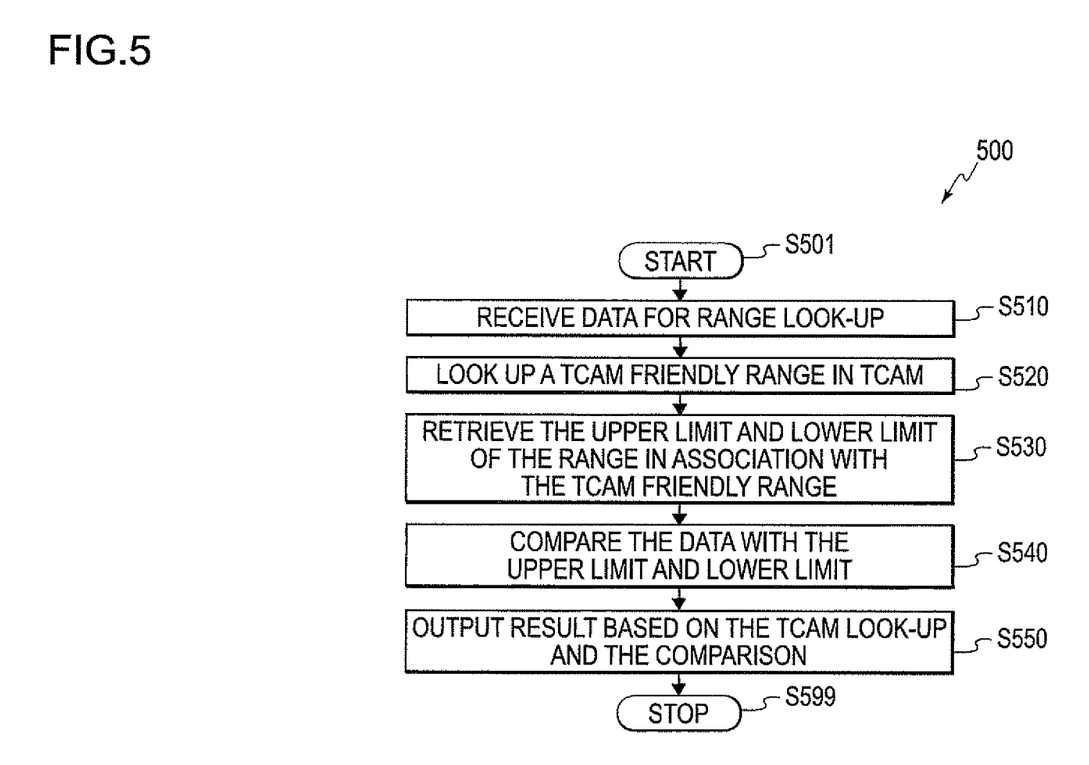
FIG. 5 shows a flow chart outlining a process example 500 according to an embodiment of the disclosure.

FIG. 5 shows a flow chart outlining a process example 500 according to an embodiment of the disclosure. The process is executed by a multi-range look-up module, such as the multi-range look-up module 110, the multi-range look-up module 310, and the like. The process starts at S501, and proceeds to 510.

At S510, the multi-range look-up module, such as the multi-range look-up module 310, receives data for range look-up. The data is then provided to the TCAM 320 and the comparator 340.

At S520, the data is used as a lookup key to search a TCAM friendly range stored in the TCAM 320. The TCAM 320 stores values corresponding to TCAM friendly ranges. The TCAM friendly ranges are respectively associated with pre-defined ranges. When the data matches a value corresponding to a TCAM friendly range stored at a TCAM entry, the TCAM 320 outputs the TCAM entry address.

At S530, an upper limit and a lower limit of a pre-defined range in association with the matching TCAM friendly range are retrieved. In the FIG. 3 example, based on the TCAM entry address output from the TCAM 320, the memory address that stores the upper limit and the lower limit of the pre-defined range in association with the matching TCAM friendly entry is determined, and then the upper limit and the lower limit can be read from the memory 330.

At S540, the upper limit and the lower limit are compared with the data to determine whether the data is within the pre-defined range of the upper limit and the lower limit. In the FIG. 3 example, the comparator 340 compares the data with the upper limit and the lower limit to make the decision, and the comparison result is provided to the combine logic 350.

At S550, a look-up result is output from the multi-range look-up module 310 based on the TCAM look-up and the comparison. In the FIG. 3 example, the combine logic 350 combines the TCAM output address with the comparison result to generate the look-up result, and outputs the look-up result. The look-up result can be used in an application that requires multi-range lookup. For example, the look-up result is used to determine an action code to be applied on a received packet. Then the process proceeds to S599 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
   a first memory configured to store a plurality of values corresponding to a first plurality of ranges and generate an output value in response to a lookup key, the output value being indicative of the lookup key matching a stored value corresponding to a first range in the first plurality of ranges;
   a second memory configured to store limiting values of a second plurality of ranges, and output a set of limiting values for a second range in association with the first range based on the output value of the first memory; and
   a comparator configured to compare the input value with the set of limiting values to determine whether the second range is inclusive of the lookup key.

2. The circuit of claim 1, further comprising:
   a combine logic configured to combine a comparison result from the comparator with the output value of the first memory to generate a lookup result of the lookup key against the second plurality of ranges.

3. The circuit of claim 2, further comprising:
   a third memory configured to store action codes in association with the second plurality of ranges, and output an action code based on the lookup result.

4. The circuit of claim 1, wherein the first memory is a ternary content addressable memory (TCAM) configured to store ternary bits.

5. The circuit of claim 4, wherein the TCAM is configured to store each of the first plurality of ranges in a single entry.

6. The circuit of claim 5, wherein the TCAM is configured to store the first range with a largest number of common most significant bits (MSBs) in the second range.

7. The circuit of claim 1, wherein each of the first plurality of ranges is inclusive of the corresponding one in the second plurality of ranges.

8. The circuit of claim 1, wherein the second memory is configured to store upper limits and lower limits of the second plurality of ranges.

9. A method, comprising:
  storing a plurality of values corresponding to a first plurality of ranges;
  storing limiting values for a second plurality of ranges that are respectively in association with the first plurality of ranges;
  generating an output value in response to a lookup key, the output value being indicative of the lookup key matching a value corresponding to a first range in the first plurality of ranges;
  determining a set of limiting values for a second range that is in association with the first range based on the output value; and
  comparing the lookup key with the set of limiting values to determine whether the second range is inclusive of the lookup key.

10. The method of claim 9, further comprising:
  combining the comparison result and the output value to generate a lookup result of the lookup key against the second plurality of ranges.

11. The method of claim 10, further comprising:
  determining an action code from a plurality of action codes in association with the second plurality of ranges based on the lookup result.

12. The method of claim 9, wherein storing the plurality of values corresponding to the first plurality of ranges further comprises:
  storing the plurality of values in a ternary content addressable memory (TCAM) configured to store the first plurality of ranges in ternary bits.

13. The method of claim 12, wherein storing the plurality of values in the TCAM configured to store the first plurality of ranges in ternary bits further comprises:
  storing the first plurality of ranges that each is determined to be storable in a single entry of the TCAM.

14. The method of claim 13, further comprising:
  storing the first range that is determined with a largest number of common most significant bits (MSBs) of the second range to include the second range.

15. The method of claim 9, wherein storing the limiting values for the second plurality of ranges further comprises:
  storing upper limits and lower limits of the second plurality of ranges.

16. A packet processor, comprising:
  a first memory configured to store a plurality of values corresponding to a first plurality of ranges and generate an output value in response to an input value of a packet parameter extracted from a received packet, the output value being indicative of the input value matching a stored value corresponding to a first range in the first plurality of ranges;
  a second memory configured to store limiting values of a second plurality of ranges, and output a set of limiting values for a second range in association with the first range based on the output value of the first memory; and
  a comparator configured to compare the input value with the set of limiting values to determine whether the second range is inclusive of the input value.

17. The packet processor of claim 16, wherein the first memory is a ternary content addressable memory (TCAM) configured to store the first plurality of ranges in ternary bits.

18. The packet processor of claim 17, wherein the TCAM is configured to store the first range with a largest number of common most significant bits (MSBs) in the second range.

19. The packet processor of claim 16, further comprising:
  a combine logic configured to combine a comparison result from the comparator with the output value of the first memory to generate a lookup result of the input value against the second plurality of ranges.

20. The packet processor of claim 19, further comprising:
  a third memory configured to store action codes in association with the second plurality of ranges, and output an action code based on the lookup result.

* * * * *